(12) United States Patent
Beat

(10) Patent No.: US 6,789,179 B2
(45) Date of Patent: Sep. 7, 2004

(54) METHOD AND SYSTEM FOR FAST DATA ACCESS USING A MEMORY ARRAY

(75) Inventor: Robert Beat, Bristol (GB)

(73) Assignee: Broadcom Corporation, Irvine, CA (US)

( * ) Notice: Subject to any disclaimer, the term of this patent is extended or adjusted under 35 U.S.C. 154(b) by 173 days.

(21) Appl. No.: 10/178,269

(22) Filed: Jun. 25, 2002

(65) Prior Publication Data

US 2003/0005255 A1 Jan. 2, 2003

Related U.S. Application Data

(60) Provisional application No. 60/301,435, filed on Jun. 29, 2001.

(51) Int. Cl.[7] .............................................. G06F 12/06
(52) U.S. Cl. ...................................................... 711/201
(58) Field of Search ................................ 711/201, 154

(56) References Cited

U.S. PATENT DOCUMENTS

| | | | | |
|---|---|---|---|---|
| 5,566,312 A | * | 10/1996 | Pedneau ...................... | 711/201 |
| 6,539,467 B1 | * | 3/2003 | Anderson et al. ........... | 711/219 |
| 6,553,474 B2 | * | 4/2003 | Ito et al. ..................... | 711/201 |
| 6,658,547 B1 | * | 12/2003 | Reynolds et al. ........... | 711/201 |

* cited by examiner

*Primary Examiner*—Kevin L. Ellis
(74) *Attorney, Agent, or Firm*—Sterne Kessler Goldstein & Fox P.L.L.C.

(57) ABSTRACT

First and second address-selection information, as well as first and second read/write information, is contemporaneously provided to various enabling circuits. The enabling circuits can then enable one or more first memory cells based on the first address-selection and first read/write information, and further enable the one or more second memory cells based on the second address-selection information and read/write information. Data can then be written to, or read from, the enabled memory cells in a single memory-access cycle.

27 Claims, 10 Drawing Sheets

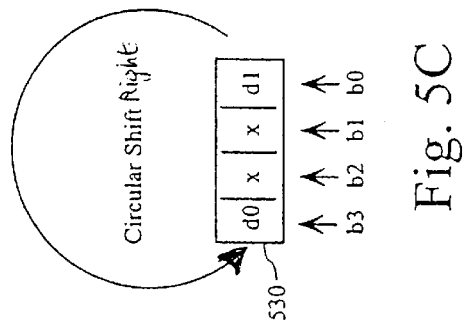
Fig. 5B
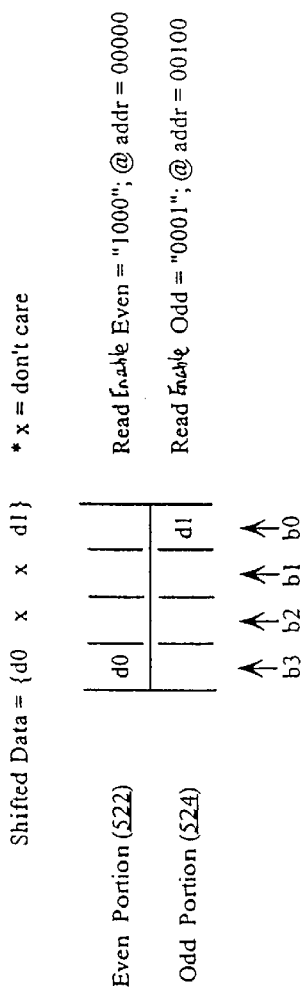
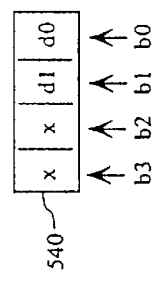
Fig. 5C
Fig. 5D

METHOD AND SYSTEM FOR FAST DATA ACCESS USING A MEMORY ARRAY

CROSS-REFERENCE TO RELATED APPLICATION

This application claims priority to Provisional U.S. Patent Application No. 60/301,435, filed Jun. 29, 2001, which is incorporated herein by reference in its entirety.

BACKGROUND OF THE INVENTION

1. Field of the Invention

This invention relates to methods and systems for fast access of computer-based memories.

2. Related Art

Modern computer-based systems often use wide memories that have a constant width. However, these systems must often manipulate a variety of variables having different data widths. For instance, a particular processor can have a thirty-two bit (four byte) wide bus with a thirty-two bit-wide random access memory (RAM), but must manipulate any number of variables having eight bit (one byte), sixteen bit (two bytes) or thirty-two bit widths.

One problem that can arise with such systems is that data can become misaligned with the physical boundaries of the available memory. For example, a first variable in a block of thirty-two bit-wide RAM may be a byte-wide variable while a second variable may be a four-byte variable. As a result, the first variable will occupy the first byte of a first memory location, while the second variable will occupy the remaining three bytes of the first memory location plus the first byte of the next memory location. One unfortunate consequence of this situation is that a computer accessing the second variable can take two separate memory-access cycles to either read or write the second variable.

While various approaches are available to align various variables having different bit-widths with the address boundaries of a memory, these approaches typically require a wasteful use of available memory resources or otherwise cannot be used with practicable systems. Accordingly, new technologies that can eliminate multiple-cycle memory accesses for misaligned data are desirable.

SUMMARY OF THE INVENTION

The invention provides techniques directed to accessing misaligned data words in an array of memory cells. In various embodiments, techniques directed to reading a misaligned data variable are provided where a first portion of the misaligned data variable resides in one or more first memory cells associated with a first address and a second portion of the misaligned data variable resides in one or more second memory cells associated with a second address.

By contemporaneously providing first and second address-selection information as well as first and second read information, enabling circuits can read-enable one or more of the first memory cells based on the first address-selection and first read information, and further read-enable the one or more of the second memory cells based on the second address-selection information and second read information. The data from the enabled memory cells can then be received and assembled by a device, such as buffer circuitry, optionally shifted, then provided to an external device.

In various other embodiments, techniques directed to writing a misaligned data variables are provided where a first portion of the misaligned data variable is directed to one or more first memory cells associated with a first address and a second portion of the misaligned data variable is directed one or more second memory cells associated with a second address.

By contemporaneously providing first and second address-selection information as well as first and second write information, enabling circuits can write-enable one or more of the first memory cells based on the first address-selection and first write information, and further write-enable the one or more of the second memory cells based on the second address-selection information and second write information. Meanwhile, a device, such as buffer circuitry, can receive the misaligned data variable from an external source, appropriately shift the misaligned data variable and provide the shifted data of the misaligned data variable to the write-enabled memory cells of the two memory locations.

Accordingly, data access operations that would take two memory-access cycles on a conventional memory system are reduced to using a single memory-access cycle. Others features and advantages will become apparent in the following descriptions and accompanying figures.

BRIEF DESCRIPTION OF THE DRAWINGS

The invention is described in detail with regard to the following figures, wherein like numerals reference like elements, and wherein:

FIGS. 5A–5D depict a second memory access operation according to the present invention;

DETAILED DESCRIPTION OF THE INVENTION

Figure 1:
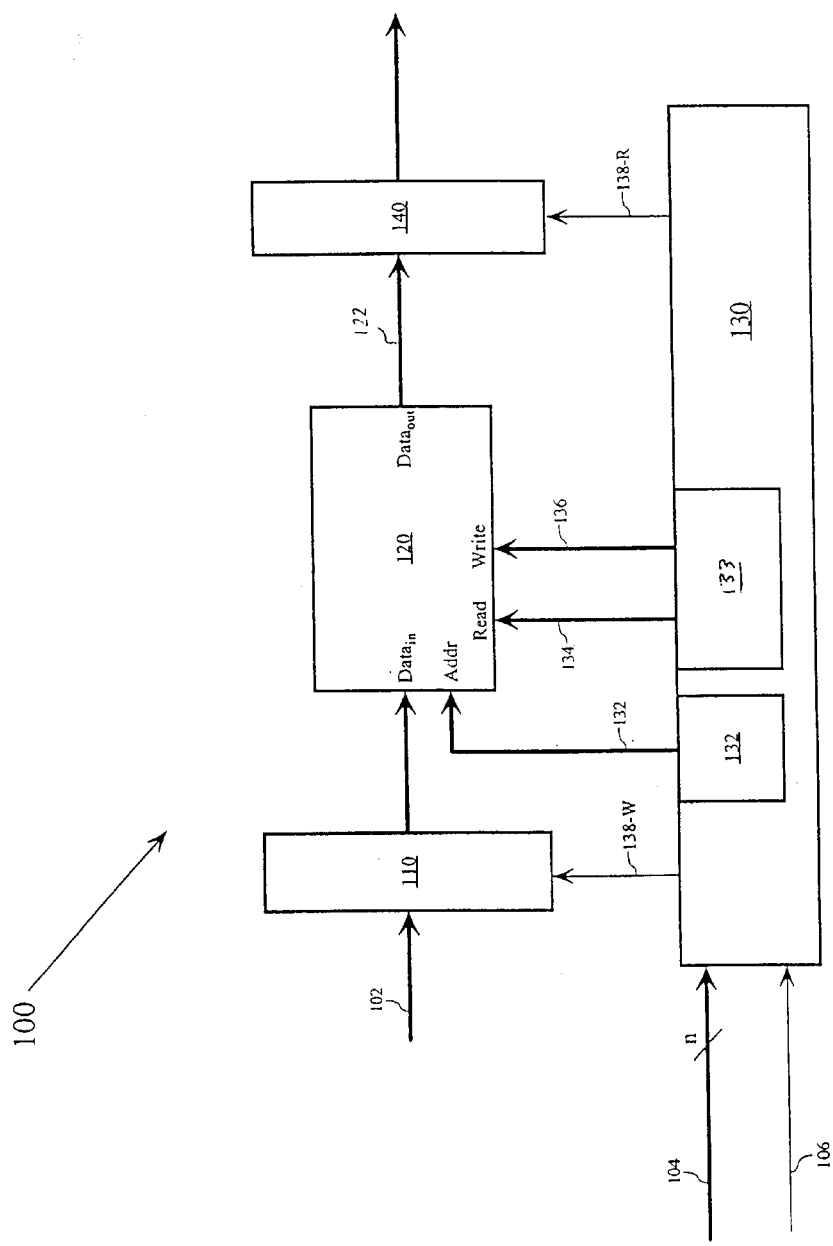
FIG. 1 is a block diagram of an exemplary system capable of accessing misaligned data in a single memory-access cycle.

A frequent problem that arises with modem computer-based systems is that, while the widths of an available physical memory are fixed, the widths of various data types can vary. For example, a particular microcomputer may have a thirty-two bit-wide memory, but may be required to access and manipulate eight-bit, sixteen-bit and thirty-two bit data. One problem that can arise with such systems is that different variables can become misaligned with the address boundaries of the physical memories.

For instance, a first data variable in a block of thirty-two bit-wide RAM may be a byte-wide variable while a second data variable may be a four-byte variable. As a result, the first data variable will occupy the first byte of a first memory location, while the second data variable will occupy the remaining three bytes of the first memory location plus the first byte of the next memory location. One unfortunate consequence of this situation is that a computer accessing the second data variable can take two separate memory-access cycles to either read or write the second variable.

However, by providing a memory array that allows contemporaneous access to two consecutive memory locations, e.g., the first and second memory locations, and that can simultaneously receive an array of read/write enable signals for the various bytes of both the even and odd memory addresses of the memory array, the misaligned data variable can be written to or read from the memory array in a single memory-access cycle. Using the example immediately above, the second data variable (represented by data bytes {d3, d2, d1, d0}) is misaligned such that the low three data variable bytes {d2, d1, d0} must be written to or read from the high three bytes {$b_0$3, $b_0$2, $b_0$1} of memory location zero and the low data variable byte {d0} must be written to or read from to the low byte {$b_1$0} of memory location one. That is, data variable bytes {d3, d2, d1, d0} must be written to or read from memory bytes {$b_1$0, $b_0$3, $b_0$2, $b_0$1} respectively.

Accordingly, by enabling the consecutive address selection signals for both of memory location zero (an even address) and memory address one (an odd address), and further providing arrays of even and odd write-enable signals {$WE_{even}$[3], $WE_{even}$[2], $WE_{even}$[1], $WE_{even}$[0]} and {$WE_{odd}$[3], $WE_{odd}$[2], $WE_{odd}$[1], $WE_{odd}$[0]}, the second data variable can be written to the memory array if the second data variable {d3, d2, d1, d0} were circular-shifted to {d0, d3, d2, d1}, write-enable signals $WE_{even}$[3], $WE_{even}$[2], $WE_{even}$[1] and $WE_{odd}$[0] are active and write-enable signals $WE_{odd}$[3], $WE_{odd}$[2], $WE_{odd}$[1], and $WE_{even}$[0] are inactive.

Similarly, misaligned data variables can be read by the enabling consecutive address selection signals for both of memory location zero and memory address one, providing the requisite active read-enable signals for the two memory locations, i.e., $RE_{even}$[3], $RE_{even}$[2], $RE_{even}$[1] and $RE_{odd}$[0], reading the enabled bytes, appropriately combining the data from enabled bytes, and then circular-shifting the combined data from {d0, d3, d2, d1} to {d3, d2, d1, d0}.

FIG. 1 is a block diagram of a memory system 100 capable of accessing misaligned data in a single memory-access cycle. As shown in FIG. 1, the system 100 includes a first data buffer block 110, a second data buffer block 140, a memory array 120 and an address device 130. The address device 130 in turn contains an address-selection device 132 and a cell-enable device 133.

For the purposes of the following discussion, the exemplary memory array 120 can have 262,144 ($2^{18}$) separately addressable memory locations with each memory location containing four byte-wide cells {b3, b2, b1, b0}. However, it should be appreciated that, in various embodiments, the number of addressable memory locations as well as the width of the individual memory locations/cells can vary without departing from the spirit and scope of the present invention.

In a first operation, an external device (not shown) can write a misaligned data variable to the memory system 100 in a single memory-access cycle. During the operation, the external device can provide a data variable to the first data buffer block 110 via link 102, and further provide address and control signals to the address device 130 via links 104 and 106 respectively.

As the address device 130 receives the address and control signals, the address device 130 can make a determination whether a particular variable is misaligned, i.e., whether the particular data variable resides in, or is directed to, two separate memory locations of the memory array 120.

If a particular data variable is misaligned, the address device 130 can provide an offset to the first data buffer block 110 via link 138-W. For example, if a particular four-byte data variable is misaligned such that the first byte of the misaligned data variable is located at the third byte of a memory location, the address device 130 can provide an offset of two to the first data buffer block 110.

As the address device 130 provides the offset to the first data buffer 110, the address device 130 can further provide address-selection information, such as an array of address-enable signals, to the memory array 120. For example, if a data variable must be written to a portion of memory location 1000, the address device 130 can activate an address signal for that memory location. Furthermore, if the a data variable must be written to a portion of memory location 1000 plus a portion of memory location 1001, the address device 130 can contemporaneously activate address signals for both memory locations.

As the address device 130 provides address-selection information, the cell-enable device 133 can provide write information to the memory array 120. The exemplary cell-enable device 133 can provide write information in the form of eight write-enable signals with four write-enable signals ($WE_{even}$) being directed to all of the memory cells having even addresses {0, 2, 4, 6, . . . } and four write-enable signals ($WE_{odd}$) being directed to all of the memory cells having odd addresses {1, 3, 5, 7 . . . }. Using the example above, assuming that a four-byte data variable is misaligned such that the low three data variable bytes {d2, d1, d0} must be written to the high three bytes {$b_0$3, $b_0$2, $b_0$1} of memory location zero and the remaining high byte {d3} must be written to the low byte {$b_1$0} of memory location one, the cell-enable device 133 can activate write-enable signals $WE_{even}$[3], $WE_{even}$[2], $WE_{even}$[1] and $WE_{odd}$[0] while keeping the remaining write-enable signals $WE_{odd}$[3], $WE_{odd}$[2], $WE_{odd}$[1], and $WE_{even}$[0] inactive.

As the address device 130 provides address, control and offset information, the first data buffer block 110 can receive the data variable along with the offset information, manipulate the data of the data variable and appropriately provide the manipulated data to the memory array 120. For example, if a received four-byte data variable is received has an offset of one, the first data buffer block 110 can shift the low three bytes of the data variable {d2, d1, d0} to the high bytes while shifting the high byte of the data variable {d3} to the low byte to form a modified data variable {d2, d1, d0, d3}. Once appropriately manipulated, the first data buffer block 110 can provide the modified data variable to the memory array 120 via the link connected therebetween.

As modified data variables are provided to the memory array 120, the memory array 120 can further receive address-selection information and write cell-enable information and appropriately store the data in the modified data variable. Again using the example above, assuming that a four-byte data variable is misaligned such that the low three data variable bytes {d2, d1, d0} must be written to the high three bytes {$b_0$3, $b_0$2, $b_0$1} of memory location zero and the high data variable byte {d3} must be written to the low byte {$b_1$0} of memory location one, the memory array 120 can receive a modified data variable {d2, d1, d0, d3} from the first data buffer block 110, receive address-selection signals for memory locations zero and one from the address-selection device 132 and receive write-enable information in the form of activated write-enable signals $WE_{even}$[3], $WE_{even}$[2], $WE_{even}$[1] and $WE_{odd}$[0] and inactive write-enable signals $WE_{odd}$[3], $WE_{odd}$[2], $WE_{odd}$[1], and $WE_{even}$[0]. Once the data, address and enable information is received, the memory array 120 can appropriately store the data.

In a second operation, the system 100 can read a misaligned data variable from the memory array 120. During operation, as an external device provides the appropriate address and control signals via links 104 and 106 respectively, the address device 130 can receive the address and control signals, provide an offset to the second data buffer 140 via link 138-R, provide the appropriate address-selection information to memory array 120 via links 132 and further provide the appropriate read cell-enable information to memory array 120 via link 134.

The memory array 120 can receive the address-selection and read cell-enable information and provide the appropriate bytes of data to the second data buffer block 140 via link 122. The second data buffer block 140 in turn can receive the data bytes from the memory array 120 and combine the received data bytes into a single data variable taking into account the offset provided by the address device 130. For example, assuming that a four-byte data variable is read with the low two bytes provided from location zero and the high two bytes provided from location one (which assumes a data offset of two), the second data buffer block 140 can receive the various bytes of data, combine the various data bytes into a single contiguous data variable having four bytes, appropriately shift the combined data by two bytes and provide the combined/shifted data variable to an external device.

The exemplary first data buffer block 110 can be a portion of integrated circuit containing various logic circuits that can receive a data variable of a given size, effectively perform a circular-barrel shift/multiplexing operation on the received data variable and provide portions of the shifted/multiplexed data variable to the memory array 120. However, it should be appreciated that, in various embodiments, the first data variable can use any combination of elements, such as shifters, barrel shifters, multiplexers, various sum-of-products-based logic, or any other known or later developed combination of systems and devices that can receive a data variable, perform the equivalent of a shifting operation on the received data variable and provide the shifted data to the memory array 120 without departing from the spirit and scope of the present invention.

The second data buffer block 140, like the first data buffer 110, can be a portion of an integrated circuit containing various logic circuits. However, like the first data buffer block 110, it should be appreciated that the second data buffer block 140 can be any device capable of receiving various portions of data from multiple memories, combine the received data portions, and provide the combined data to an external device without departing from the spirit and scope of the present invention. Furthermore, in various embodiments, it should be appreciated that the functions of the first buffer block 110 and second buffer block 140 can be combined into a single buffering device and that the combined buffering device can interact with the memory array using a bi-directional bus system.

The address device 130, like the first and second data buffer blocks 110 and 140, can be a collection of logic circuits on a portion of an integrated circuit. However, it should be appreciated that the address device 130 can be any combination of systems and devices capable of receiving address and control signals from an external device and providing address-selection and enable information to memory array 120 as well as offset information to the data buffer blocks 110 and 130 without departing from the spirit and scope of the present invention.

Figure 2:
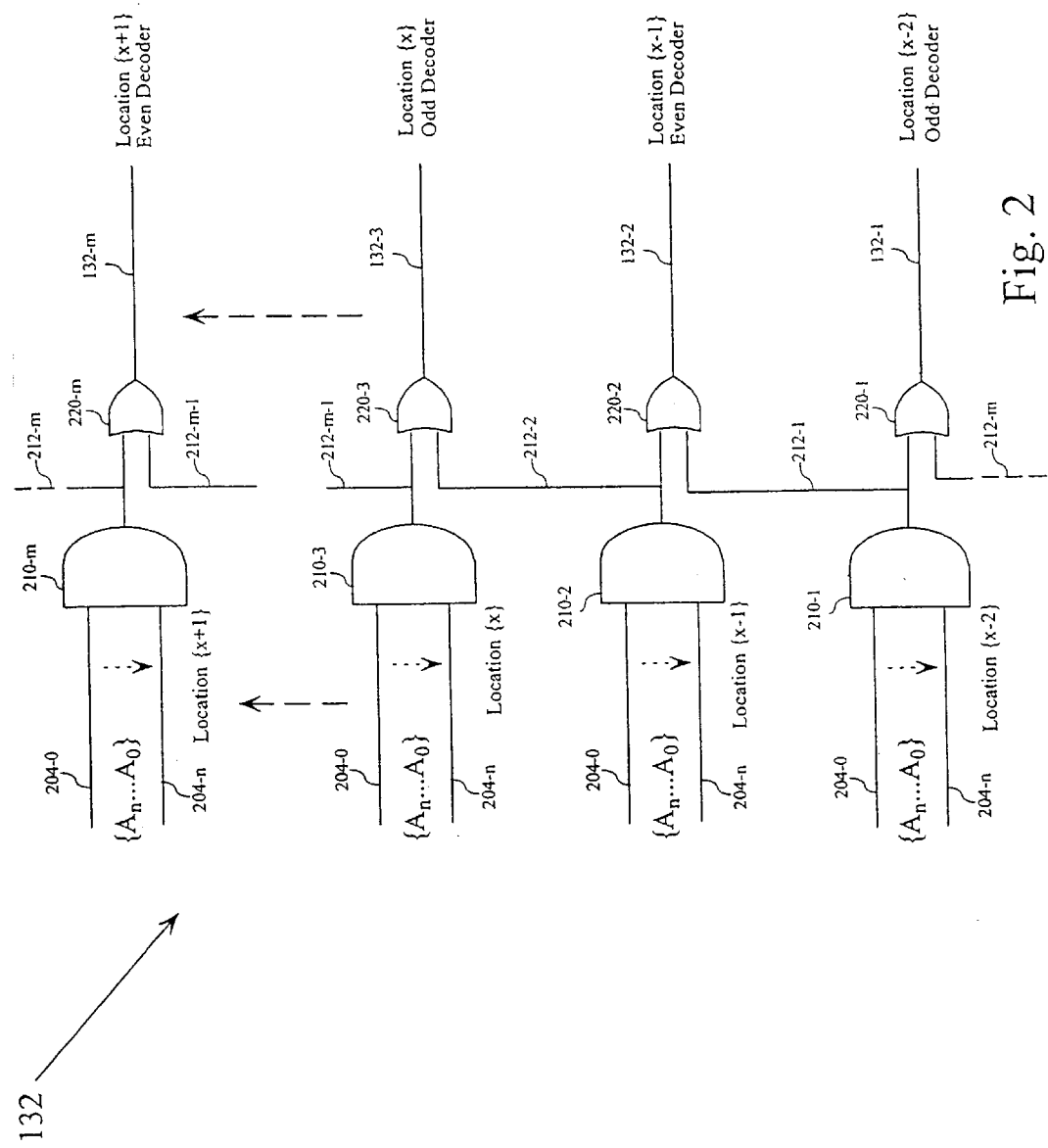
FIG. 2 depicts the location-enable device of the system of FIG. 1.

FIG. 2 depicts the address-selection device 132 of FIG. 1. As shown in FIG. 2, the address-selection device 132 contains a number of sequential address decoders 210-1, 210-2, ... 210-m and a number of logical "OR" gates 220-1, 220-2 ... 220-m. In operation, the address decoders 210-1, 210-2, ... 210-m can receive an address $\{A_n \ldots A_0\}$ using address lines 204-0 ... 204-n and provide address-selection signals { ... , x–2, x–1, x, x+1, ... } to the "OR" gates 220-1, 220-2 ... 220-m based on the received address. For example, if the received address is zero, then address decoder 210-1 {x–2} can generate an active address signal, while the remaining address decoders 210-2, 210-3, ... 210-m generate inactive address signals. Further, if the received address is one, then address decoder 210-2 {x–1} can generate an active address signal. Still further, if the received address is two, then address decoder 210-3 {x} can generate an active address signal, and so on.

As the appropriate address decoder generates an active address signal, the various address signals, active and inactive, are provided to the "OR" gates 220-1, 220-2, ... 220-m via links 112-1, 112-2, ... 112-m. The "OR" gates 220-1, 220-2, ... 220-m can receive the address signals and then provide address-selection signals to a device, such as a memory array via links 132-1, 132-2, ... 132-m. Accordingly, for each address signal generated by an address decoder, two "OR" gates will generate address-selection signals. For example, if address decoder 210-2 generates an active address signal, then "OR" gates 220-2 and 220-3 will generate active address-selection signals. Similarly, in order to provide a memory wrap-around function, if address decoder 212-m generates an active address signal, then "OR" gates 220-m and 220-0 (not shown) will generate active address-selection signals as "OR" gate 220-0 receives an address signal from address decoder 220-m via link 212-m.

Figure 3:
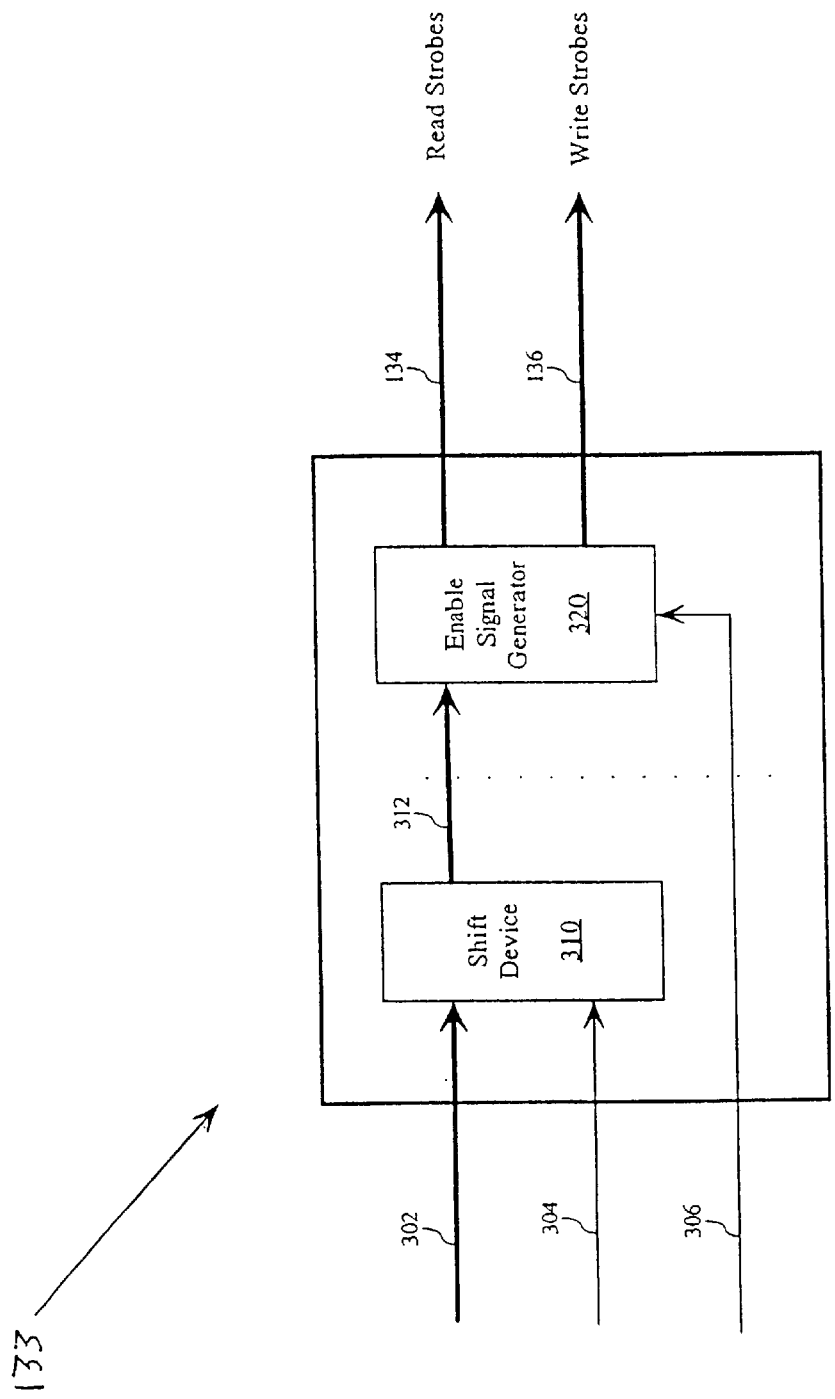
FIG. 3 is a block diagram of the cell-enable device of the system of FIG. 1.

FIG. 3 is a block diagram of the exemplary cell-enable device 133 of FIG. 1. As shown in FIG. 1, the cell-enable device 133 includes a shift device 310 and an enable signal generator 320. In operation, the shift device 310 can receive data strobe information via link 302 and offset information via link 304. The shift device 310 can then perform a circular-shift on the received strobe information according to the offset information. For example, if a misaligned two-byte data variable {0, 0, d1, d0} is to be written/read, the shift device 310 can receive a four-bit strobe pattern of "0011". Assuming that the respective offset is three and the low byte {d0} is to be written to an even address and {d1} is to be written to an odd address, the shift device 310 can store the four-bit pattern in an eight-bit register to form a second pattern "0000 0011" and then circular-shift the second pattern three bits to the left to form a third pattern "0001 1000". The shift device 310 can then provide the third pattern to the enable signal generator 320 via link 312.

The enable signal generator 320 can receive the third strobe pattern, further receive a read/write indication via link 306, combine the third pattern and read/write indication and generate eight write-enable signals $\{WE_{odd}[3], WE_{odd}[2], WE_{odd}[1], WE_{odd}[0], WE_{even}[3], WE_{even}[2], WE_{even}[1], WE_{even}[1]\}$ and eight read-enable signals $\{RE_{odd}[3], RE_{odd}[2], RE_{odd}[1], RE_{odd}[0], RE_{even}[3], RE_{even}[2], RE_{even}[1], RE_{even}[0]\}$. Depending on the state of the read/write indication, only a subset of one of the write-enable signals or read-enable signals will be activated. For the example above, assuming the enable signal generator 320 receives a pattern of "0001 1000" and a write indication, only $WE_{odd}[0]$ and $WE_{even}[3]$ will activate while the remaining enable signals will remain inactive. Conversely, assuming the enable signal generator 320 receives a pattern of "0111 1000" and a read indication, only $RE_{odd}[2], RE_{odd}[1], RE_{odd}[0]$ and $RE_{even}[3]$ will activate.

Once the enable signals are generated, the read-enable strobes can be provided to a device, such as a memory array via link 134 and the write enable signals can be provided via link 136.

Figure 4A:
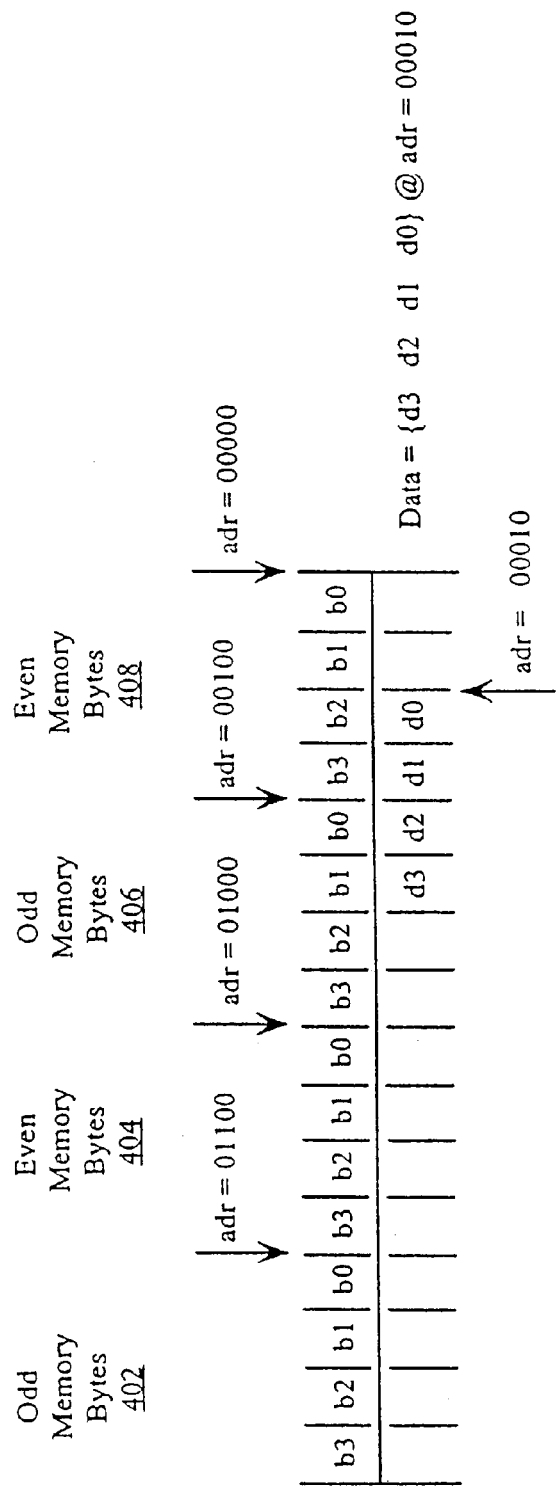
FIGS. 4A–4D depict a first memory access operation according to the present invention.

FIGS. 4A–4D depict the operations of a misaligned data word being written to a system, such as a memory system depicted in FIGS. 1–3. As shown in FIG. 4A, a data variable {d3, d2, d1, d0} can be misaligned with respect to a physical memory having a number of memory locations 402, 404, 406 and 408 with each memory location having four bytes {b3, b2, b1, b0}.

Because the exemplary data variable is offset by two bytes, the low two data variable bytes {d1, d0} can be written to bytes {b3, b2} of memory location 408, while data variable bytes {d3, d2} can be written to memory bytes {b1, b0} of memory location 406.

Figure 4B:
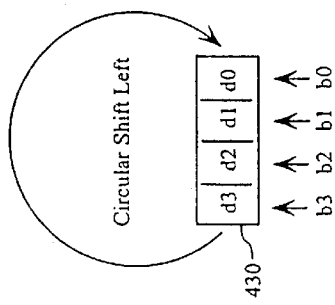
Figure 4C:
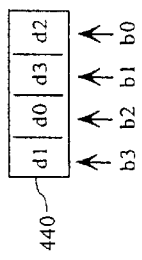
Figure 4D:
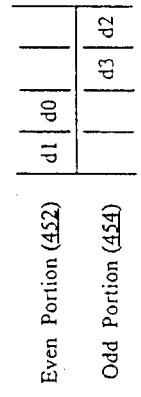

FIG. 4B depicts the data variable 430 {d3, d2, d1, d0} shown in FIG. 4A as it would be presented to a buffering device capable of performing a circular-shift. FIG. 4C depicts a circular-shifted data variable 440 {d1, d0, d3, d2} derived from the data variable 430 {d3, d2, d1, d0} shown in FIG. 4B. FIG. 4D depicts the data variable 430 {d3, d2, d1, d0} shown in FIG. 4A divided into an even portion 452 and an odd portion 454. As shown in FIG. 4D, because only the high two bytes {b3, b2} of the even portion 452 are to be written to, a write enable pattern="1100" representing an array of write-enable signals can be provided to an array of individual byte-wide memory cells of an even memory location (at a relative address of "00000") to enable write operations at the appropriate memory cells. Similarly, because only the low two bytes {b1, b0} of the odd portion 454 are to be written, a write enable pattern of "0011" can be similarly applied to another array of memory cells located at a relative address of "0100" to enable write operations at the appropriate odd memory cells.

FIGS. 5A–5D depict a second memory access operation where a misaligned two-byte data variable {d1, d0} is read from a memory array in a single memory-access cycle. As shown in FIG. 4A, the data variable {d1, d0} can be misaligned with respect to a physical memory having a number of memory locations 502, 504, 506 and 508 with each memory location having four bytes {b3, b2, b1, b0}. The exemplary data variable {d1, d0} has an offset of three bytes such that data variable byte {d0} can be read from memory byte {b3} of even memory location 508 and data variable byte {d1} can be read from memory byte {b0} of odd memory location 506.

Figure 5A:
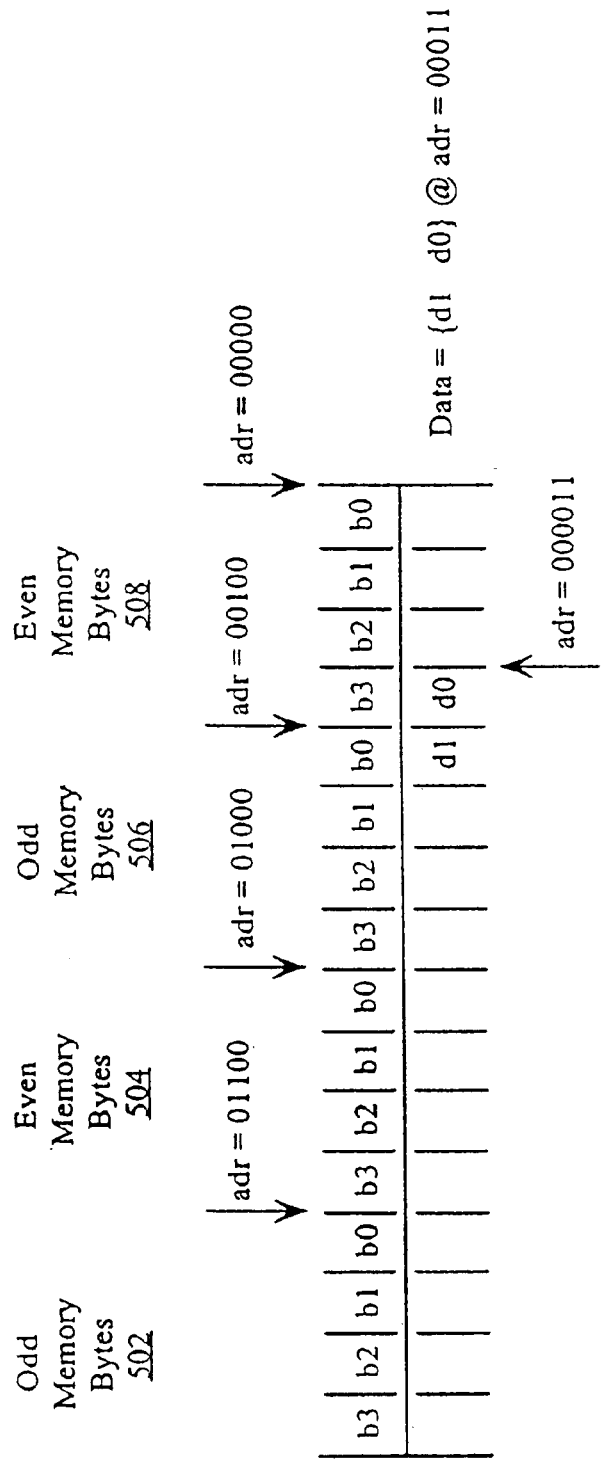

FIG. 5B depicts the data variable {d1, d0} of FIG. 5A as it would be received from a memory array including an even portion 522 and an odd portion 524 with data variable byte {d0} included in the even portion 522 and data variable byte {d1} included in the odd portion 524. Also shown in FIG. 5B, because only the upper byte {b3} of the even portion 522 is to be read, a read enable pattern of "1000" can be applied to an array of byte-wide memory cells of an even memory location. Similarly, because only data byte {b0} is to be read from the odd portion 524, a read enable pattern of "0001" can be applied to an array of byte-wide memory cells of an odd memory location. The x values ("don't care") indicate that we are not concerned with the data of these bytes for the purposes of this explanation. FIG. 5C demonstrates that the received bytes {d1} and {d0} can be received by a device, such as a data buffer block, and combined to form a combined data variable 530 {d0, x, x, d1}. FIG. 5D depicts a combined/shifted data variable 540 {x, x, d1, d0} derived from the combined data variable 530 of FIG. 5C.

As shown in FIGS. 4A–4D and 5A–5D, the respective even and odd enable patterns are disjoint. That is, there are no odd write signals active at the same time their respective even write pattern. By making the even and odd patterns disjoint, there will be no contention problems during read operations or erroneous write operations, e.g., double writes to bytes in both the first and second memory locations.

Figure 6:
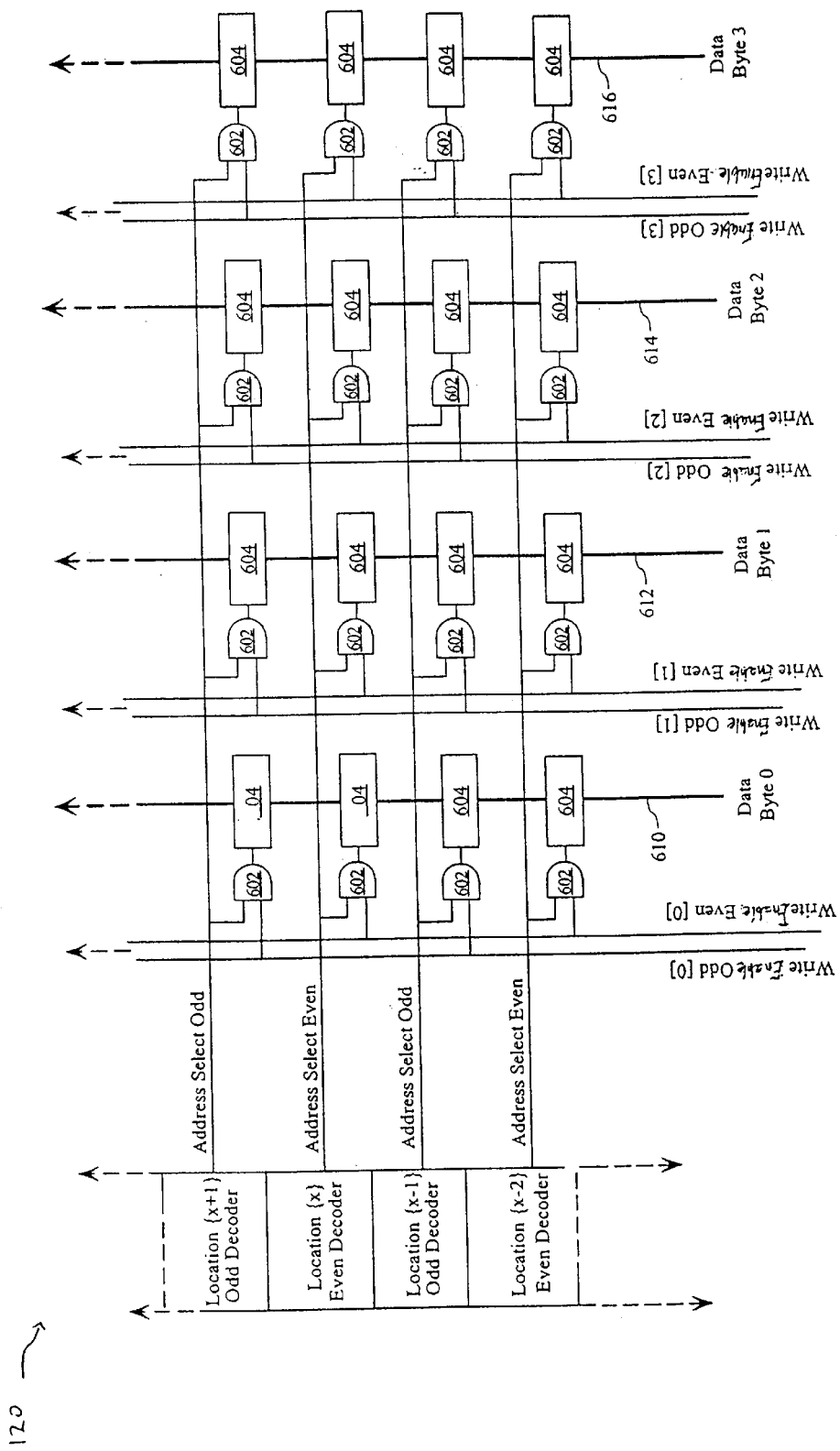
FIG. 6 is a block diagram of the memory array of the system of FIG. 1.

FIG. 6 depicts an exemplary embodiment of the memory array 120 of FIG. 1. As shown in FIG. 6, the memory array 120 contains a number of byte-wide memory cells 604 coupled to a number of respective "AND" gates 602. In operation, each "AND" gate 602 can receive address-selection information in the form of an even or odd address select signal {x−2, x−1, x, x+1}, and further receive write information in the form of one of various available write-enable signals {$WE_{even}[3]$, $WE_{odd}[3]$, $WE_{even}[2]$, $WE_{odd}[2]$, $WE_{even}[1]$, $WE_{odd}[1]$, $WE_{even}[0]$, $WE_{odd}[0]$}.

As the "AND" gates 602 receive their address-selection information and write information, the "AND" gates 602 can produce a logical "AND" operation on the received information and provide the result to their respective memory cells 604. If a particular "AND" gate 602 receives both an active address-select signal and active write-enable signal, the particular "AND" gate 602 can enable its respective memory cell 604 to receive and store data. Accordingly, any data placed on a respective data byte line 610, 612, 614 or 616 can be stored in the enabled memory cells 604.

While FIG. 6 depicts a memory array having the logic required to write data to the various memory cells 604, it should be appreciated that respective read operations can be performed by substituting or complementing the write-enable lines with read-enable lines to receive read-enable information. Accordingly, a particular memory cell 604 can be read-enabled by providing address-selection information and read information to the respective "AND" gate associated with the particular memory cell 604. Any data residing in the particular memory cells 604 could then be placed on the appropriate data byte line 610, 612, 614 or 616.

Figure 7:
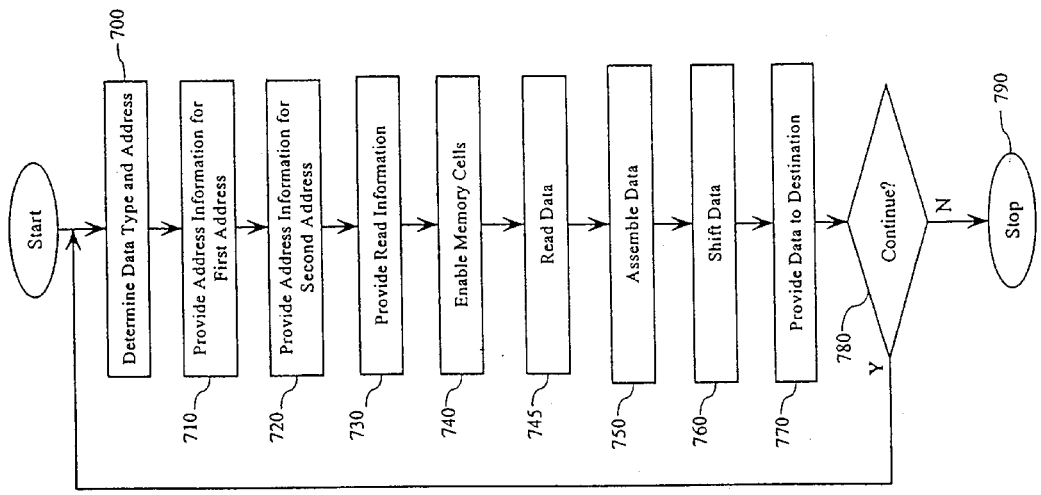
FIG. 7 is a flowchart outlining a first exemplary operation according to the present invention.

FIG. 7 depicts a flowchart outlining a first exemplary memory-access operation directed to reading a misaligned data variable from a memory in a single memory-access cycle. The process starts at step 700 where the size of the data variable to be read as well as the address of the data variable are determined. Next, in step 710, first address-selection information relating to a first address is provided to an array of memory cells, such as the memory cells of the memory system depicted in FIGS. 1–6. Then, in step 720, second address-selection information relating to a second address is provided to the array of memory cells.

As discussed above, the first and second address-selection information can be based on a single received address and, in various embodiments, the second address can be incrementally larger than the first address. Also as discussed above, the first and second address-selection information can be provided within a single memory-access cycle or otherwise contemporaneously provided such that a read operation can be executed in a single memory-access cycle. Control continues to step 730.

In step 730, first and second read information are provided to the first and second memory addresses respectively. Next, in step 740, a first subset of the available memory cells of the first memory address as well as a second subset of the available memory cells of the second memory address are enabled based on the address-selection and read information. Then, in step 745, the first and second enabled memory cells are read. That is, a first portion of the data variable residing in the first enabled memory cells and a second portion of the data variable residing in the second enabled memory cells are received by a device, such as a data buffer. Control continues to step 750.

In step 750, the first and second data portions are assembled into a single data variable. As discussed above, assembling a data variable can include logically combining the data portions by performing a logical "OR" operation. Next, in step 760, the assembled data can be shifted by a predetermined number of bits such that the assembled data can be aligned with the least significant bit/byte of a logical bus or other device. While the exemplary technique uses a shifting operation, as discussed above, it should be appreciated that various other equivalent operations can be performed, such as a multiplexing operation. Control continues to step 770.

In step 770, the assembled/shifted data can be provided to an external device. Next, in step 780, a determination is made as to whether to continue reading data variables. If further data variables are to be read, control jumps back to step 700; otherwise, control continues to step 790 where the process stops.

Figure 8:
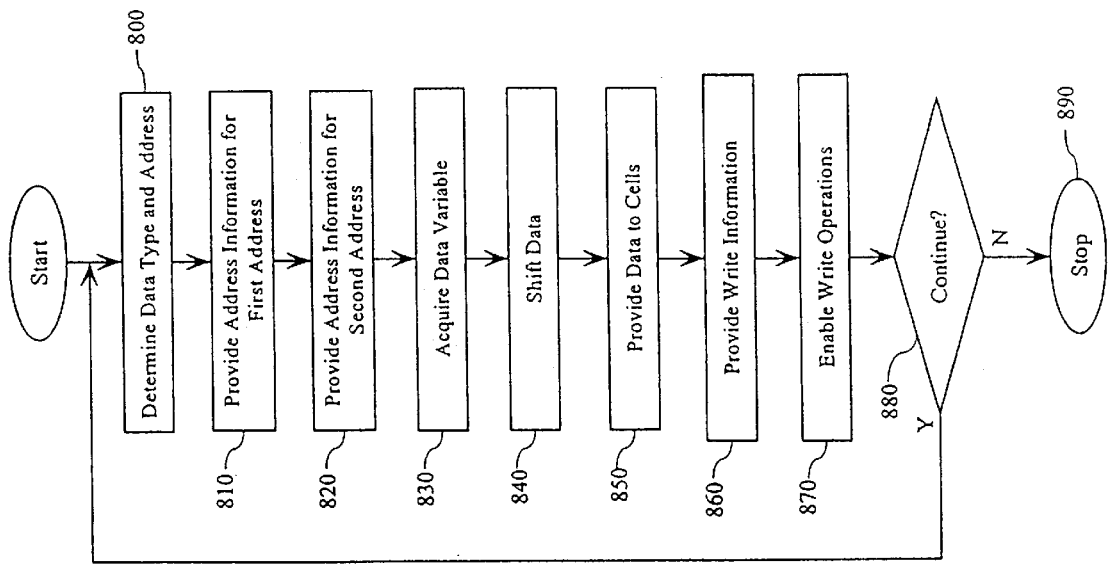
FIG. 8 is a flowchart outlining a second exemplary operation according to the present invention.

FIG. 8 depicts a flowchart outlining a second exemplary operation directed to writing a misaligned data variable to a memory in a single memory-access cycle. As shown in FIG. 8, the process starts at step 800 where the size and address of the data variable are determined. Next, in step 810, first address-selection information relating to a first address is provided to an array of memory cells. Then, in step 820, second address-selection information relating to a second address is provided to the array of memory cells. Control continues to step 830.

In step 830, the data variable of step 800 is acquired by a device, such as a data buffer. Then, in step 840, the data in the data variable can be shifted by a predetermined amount such that a first portion of the data variable can be written to an appropriate number of memory cells associated with the first address and a second portion of the data variable can be written to an appropriate number of memory cells associated with the second address. Next, in step 860, the data of the shifted data variable is divided into first and second portions, and the first and second portions are provided to the appropriate memory cells of the first and second addresses. Control continues to step 860.

In step 860, first and second write information are provided to the first and second memory addresses. Next, in step 870, the appropriate memory cells of the first memory address as well as the appropriate memory cells of the second memory address are enabled to perform write operations, i.e., the appropriate memory cells are enabled to store the data of the data variable. Then, in step 880, a determination is made as to whether to continue to write various data variables. If the operation is to continue, control jumps back to step 800; otherwise, control continues to step 890 where the process stops.

After a particular write operation, it should be appreciated that the various data variables written according to the technique outlined in FIG. 8 may eventually be read. Accordingly, it should be appreciated that the read techniques outlined in FIG. 7 and otherwise described in FIGS. 1–6 can be applied to read the various data variables.

As shown in FIGS. 1–6, the systems and methods of this invention are preferably implemented using dedicated logic or other integrated circuits. However, the systems and methods can also be implemented using any combination of one or more general purpose computers, special purpose computers, program microprocessors or microcontroller and peripheral integrating circuit elements, hardware electronic or logic circuits such as application specific integrated circuits (ASICs), discrete element circuits, programmable logic devices such as PLAs, FPGAs, PALs or the like. In general, any device on which exists a finite state machine capable of implementing the various elements of FIGS. 1–6 and the flowcharts of FIGS. 7 and 8 can be used to implement the sequence of functions.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method for reading a misaligned data variable from an array of memory cells, wherein a first portion of the misaligned data variable resides in one or more first memory cells relating to a first address, and wherein a second portion of the misaligned data variable resides in one or more second memory cells relating to a second address, the method comprising:
   providing first address-selection information relating to the first address;
   providing second address-selection information relating to the second address, wherein the second address is not equal to the first address, and wherein the first address-selection information and the second address-selection information are contemporaneously provided;
   providing first read information;
   providing second read information;
   read enabling the one or more first memory cells based on the first address-selection information and first read information;
   read enabling the one or more second memory cells based on the second address-selection information and second read information; and
   assembling the data variable from the first data portion of the one or more first enabled memory cells and the second data portion of the one or more second enabled memory cells.

2. The method of claim 1, wherein the first address-selection information and the second address-selection information are provided based on a single received address.

3. The method of claim 2, wherein the second address is incrementally larger than the first address.

4. The method of claim 1, wherein the misaligned data variable is read in a single memory-access cycle.

5. The method of claim 4, further comprising performing a shift operation on the assembled data variable.

6. The method of claim 5, wherein the first and second enabled memory cells are disjoint and wherein the first enabled memory cells are a subset of memory cells available at the first address.

7. A method for writing a misaligned data variable to an array of memory cells, wherein a first portion of the misaligned data variable is directed to one or more first memory cells relating to a first address, and wherein a second portion of the misaligned data variable is directed to one or more second memory cells relating to a second address, the method comprising:
   providing first address-selection information relating to the first address;

providing second address-selection information relating to the second address, wherein the second address is not equal to the first address, and wherein the first address-selection information and the second address-selection information are contemporaneously provided;

providing first write information;

providing second write information;

write enabling the one or more first memory cells based on the first address-selection information and first write information;

write enabling the one or more second memory cells based on the second address-selection information and second write information;

providing the first data portion to the one or more first enabled memory cells; and providing the second data portion to the one or more second enabled memory cells.

8. The method of claim 7, wherein the first address-selection information and the second address-selection information are provided based on a single received address.

9. The method of claim 8, wherein the second address is incrementally larger than the first address.

10. The method of claim 7, wherein the misaligned data variable is written in a single memory-access cycle.

11. The method of claim 10, further comprising performing a shift operation on the data variable before providing the first data portion to the one or more first enabled memory cells.

12. The method of claim 5, wherein the first and second enabled memory cells are disjoint and wherein the first enabled memory cells are a subset of memory cells available at the first address.

13. The method of claim 5, further comprising performing a single-cycle read operation of the misaligned data variable, the single-cycle read operation including the steps of:

contemporaneously receiving the first data portion from the one or more first enabled memory cells and the second data portion from the one or more second enabled memory cells; and assembling the first received data portion with the second received data portion to form the data variable.

14. A memory system that can read a misaligned data variable from an array of memory cells, comprising:

an address device that contemporaneously provides at least first address-selection information relating to a first memory address and second address-selection information relating to a second memory address, wherein the second address is not equal to the first address, and wherein the address device further provides first read information and second read information;

first enabling circuits that enable one or more first memory cells relating to the first address based on the first address-selection information and first read information;

second enabling circuits that enable one or more second memory cells relating to the second address based on the second address-selection information and second read information; and a buffer circuitry that receives a first data portion of the misaligned data variable from the first enabled memory cells and a second data portion of the misaligned data variable from the second enabled memory cells, assembles the first and second data portions and provides the assembled data portions to an external device.

15. The memory system of claim 14, wherein the misaligned data variable is read in a single memory-access cycle.

16. The memory system of claim 14, wherein the address device provides the first and second address-selection information based on a single received address.

17. The memory system of claim 16, wherein the second address is incrementally larger than the first memory address.

18. The memory system of claim 15, wherein the buffer circuitry further performs a shift operation on the assembled data variable.

19. The memory system of claim 15, wherein the first and second enabled memory cells are disjoint and wherein the first enabled memory cells are a subset of memory cells available at the first address.

20. A memory system that can write a misaligned data variable to an array of memory cells, comprising:

an address device that contemporaneously provides at least first address-selection information relating to a first memory address and second address-selection information relating to a second memory address, wherein the second address is not equal to the first address, wherein the address device further provides first write information and second write information;

first enabling circuits that write-enable one or more first memory cells relating to the first address based on the first address-selection information and first write information;

second enabling circuits that write-enable one or more second memory cells relating to the second address based on the second address-selection information and second write information; and a buffer circuitry that provides a first portion of the misaligned data variable to the first enabled memory cells, and further provides a second portion of the misaligned data variable to the second enabled memory cells.

21. The memory system of claim 20, wherein the misaligned data variable is written in a single memory-access cycle.

22. The memory system of claim 20, wherein the address device can further provide first read information and second read information;

wherein the first enabling circuits can read-enable the one or more first memory cells based on the first address-selection and read information, and the second enabling circuits can read-enable one or more second memory cells based on the second address-selection and read information; and wherein the buffer circuitry can receive the first data portion from the first enabled memory cells and the second data portion from the second read-enabled memory cells, assemble the first and second data portions and provide the assembled data portions to an external device.

23. The memory system of claim 22, wherein the address device provides the first and second address-selection information based on a single received address.

24. The memory system of claim 23, wherein the second address is incrementally larger than the first memory address.

25. The memory system of claim 21, wherein the buffer further performs a shift operation on the data variable before providing the first data portion to the one or more first enabled memory cells.

26. A memory system for performing single-cycle accesses of data variables held in a memory array; including data variables which are misaligned with respect to an address boundary of the memory array such that a first portion of a data variable is held at a first address location and a second portion of the data variable is held at a second, different address location, the memory system comprising:

address selection circuitry operable to provide first address selection information and second address selection information, the first and second address selection information respectively indicating different address locations for the first and second portion of the data variable and being provided substantially simultaneously;

enable circuitry operable to provide an enable signal to enable an access of a predetermined type to selected ones of the memory locations; and buffer circuitry operable to hold and, manipulate the first and second data portions as necessary for supply between the memory system and other circuitry.

27. The memory system of claim 26, wherein a first portion of the data variable is held at an even address location and the second portion of the data variable is held at an odd address location, and wherein the address selection circuitry is operable to provide even and odd address selection information substantially simultaneously.

* * * * *